(12) United States Patent
Camacho et al.

(10) Patent No.: US 7,977,779 B2
(45) Date of Patent: Jul. 12, 2011

(54) MOUNTABLE INTEGRATED CIRCUIT PACKAGE-IN-PACKAGE SYSTEM

(75) Inventors: Zigmund Ramirez Camacho, Singapore (SG); Arnel Senosa Trasporto, Singapore (SG); Lionel Chien Hui Tay, Singapore (SG); Henry Descalzo Bathan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 190 days.

(21) Appl. No.: 12/136,768

(22) Filed: Jun. 10, 2008

(65) Prior Publication Data

US 2009/0302452 A1    Dec. 10, 2009

(51) Int. Cl.
*H01L 23/50* (2006.01)
(52) U.S. Cl. .. 257/678; 257/687; 257/737; 257/E23.079
(58) Field of Classification Search .......... 257/678–700, 257/734–738, 779–784, 787–796, E23.079; 438/787–790
See application file for complete search history.

(56) References Cited

U.S. PATENT DOCUMENTS

| 6,072,239 A | 6/2000 | Yoneda et al. |
| 6,191,494 B1 | 2/2001 | Ooyama et al. |
| 6,774,449 B1 | 8/2004 | Nishii et al. |
| 7,687,897 B2 * | 3/2010 | Ha et al. .................. 257/686 |
| 2007/0187826 A1 | 8/2007 | Shim et al. |
| 2007/0257348 A1 | 11/2007 | Yang |

* cited by examiner

*Primary Examiner* — Thanh Nguyen
(74) *Attorney, Agent, or Firm* — Mikio Ishimaru

(57) ABSTRACT

A mountable integrated circuit package-in-package system includes: providing an interface integrated circuit package system with a terminal having a plated bumped portion of an inner encapsulation; mounting the interface integrated circuit package system over a package carrier with the terminal facing away from the package carrier; connecting the package carrier and a pad extension of the terminal; and forming a package encapsulation over the interface integrated circuit package system with the terminal exposed.

20 Claims, 7 Drawing Sheets

MOUNTABLE INTEGRATED CIRCUIT PACKAGE-IN-PACKAGE SYSTEM

TECHNICAL FIELD

The present invention relates generally to an integrated circuit package system and more particularly to a mountable integrated circuit package-in-package system.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package. Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

In response to the demands for improved packaging, many innovative package designs have been conceived and brought to market. The multi-chip module has achieved a prominent role in reducing the board space used by modern electronics. However, multi-chip modules, whether vertically or horizontally arranged, can also present problems because they usually must be assembled before the component chips and chip connections can be tested. That is, because the electrical bond pads on a die are so small, it is difficult to test die before assembly onto a substrate. Thus, when die are mounted and connected individually, the die and connections can be tested individually, and only known-good-die ("KGD") that is free of defects is then assembled into larger circuits. A fabrication process that uses KGD is therefore more reliable and less prone to assembly defects introduced due to bad die. With conventional multi-chip modules, however, the die cannot be individually identified as KGD before final assembly, leading to KGD inefficiencies and assembly process yield problems.

Numerous package approaches stack multiple integrated circuit dice or package in package (PIP) or a combination. Other approaches include package level stacking or package on package (POP). Both concepts include stacking of two or more packages. KGD and assembly process yields are not an issue since each package can be tested prior to assembly, allowing KGD to be used in assembling the stack. But stacking integrated devices, package-in-package, package-on-package, or combinations thereof have assembly process difficulties caused by leaded packages having limited input and output (I/O) which limits its role 3D packaging. Current leaded packages also do not provide the flexibility to support the various integration and stacking options described earlier with the higher I/O count support.

Thus, a need still remains for a mountable integrated circuit package-in-package system providing low cost manufacturing, improved yield, improved reliability, and high density I/O count. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a mountable integrated circuit package-in-package system including providing an interface integrated circuit package system with a terminal having a plated bumped portion of an inner encapsulation; mounting the interface integrated circuit package system over a package carrier with the terminal facing away from the package carrier; connecting the package carrier and a pad extension of the terminal; and forming a package encapsulation over the interface integrated circuit package system with the terminal exposed.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
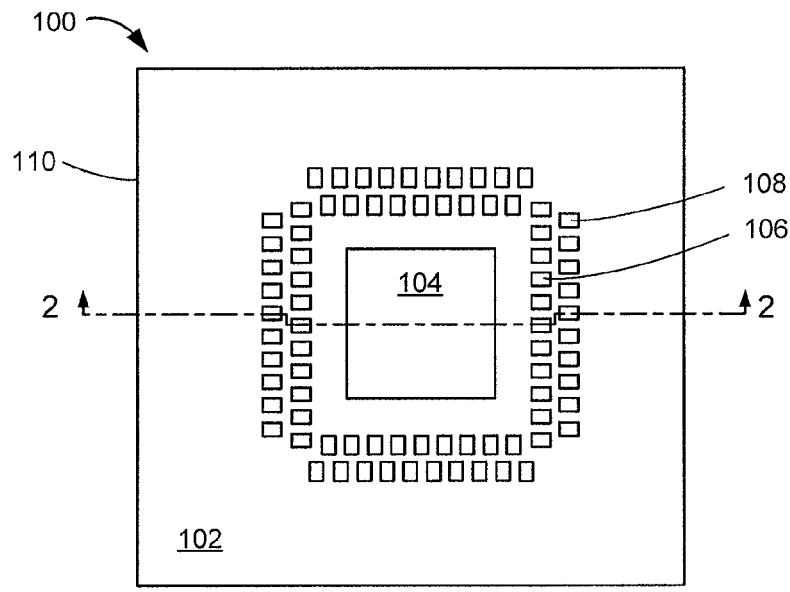
FIG. 1 is a top view of a mountable integrated circuit package-in-package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of a mountable integrated circuit package-in-package system 100 in a first embodiment of the present invention. The top view depicts a package encapsulation 102, such as a cover with an epoxy molding compound, partially exposing a paddle 104, inner terminals 106, and outer terminals 108.

For illustrative purposes, the mountable integrated circuit package-in-package system 100 is shown with one row of the inner terminals 106 and one row of the outer terminals 108 in a staggered configuration along all sides 110 of the mountable integrated circuit package-in-package system 100, although it is understood that the mountable integrated circuit package-in-package system 100 can include a different number of rows. For example, the mountable integrated circuit package-in-package system 100 can have more than one row of the inner terminals 106, more than one row of the outer terminals 108, or different number of rows between the inner terminals 106 and the outer terminals 108 along each of the sides 110.

Figure 2:
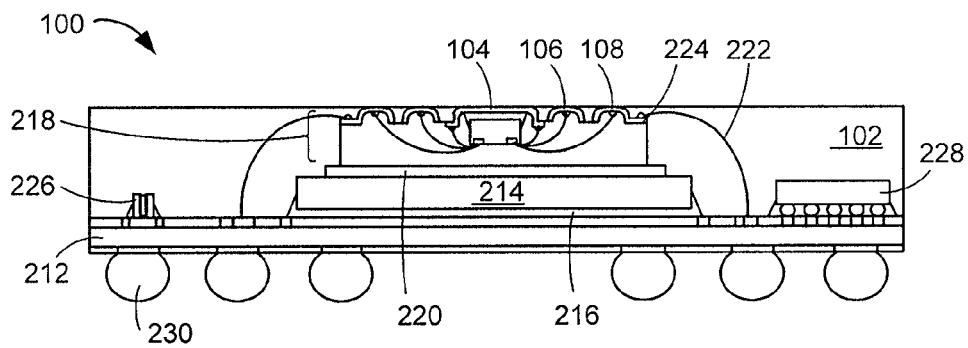
FIG. 2 is a cross-sectional view of the mountable integrated circuit package-in-package system along line 2-2 of FIG. 1.

Referring now to FIG. 2, therein is shown a cross-sectional view of the mountable integrated circuit package-in-package system 100 along line 2-2 of FIG. 1. The cross-sectional view depicts a package carrier 212, such as a laminated substrate. An integrated circuit 214, such as an integrated circuit die, can be mounted over the package carrier 212 with a first adhesive 216, such as a die-attach adhesive. The integrated circuit 214 is optional.

An interface integrated circuit package system 218 can be over the integrated circuit 214 with a second adhesive 220 such as film adhesive. The interface integrated circuit package system 218 includes the paddle 104, the inner terminals 106, and the outer terminals 108, which are facing away from the integrated circuit 214. The interface integrated circuit package system 218 can be tested without assembly of the mountable integrated circuit package-in-package system 100 ensuring known good device (KGD) are assembled therein. This improves manufacturing yield and reduces cost.

First interconnects 222, such as bond wires, ribbon bond wires, or reverse standoff stitch bonding (RSSB), can connect between pad extensions 224 of the outer terminals 108 of the interface integrated circuit package system 218 and the package carrier 212. A first device 226, such as discrete passive components, and a second device 228, such as a flip chip, a wire bonded integrated circuit die, a ball grid array device, or a land grid array device, can be mounted over the package carrier 212.

The package encapsulation 102 can cover the integrated circuit 214, the first interconnects 222, the first device 226, and the second device 228 over the package carrier 212. The package encapsulation 102 partially exposes the interface integrated circuit package system 218 with the paddle 104, the inner terminals 106, and the outer terminals 108 exposed. External interconnects 230, such as solder balls, can attach to and below the package carrier 212 for electrical connection to the next system level (not shown), such as a printed circuit board or another integrated circuit package system.

Figure 3:
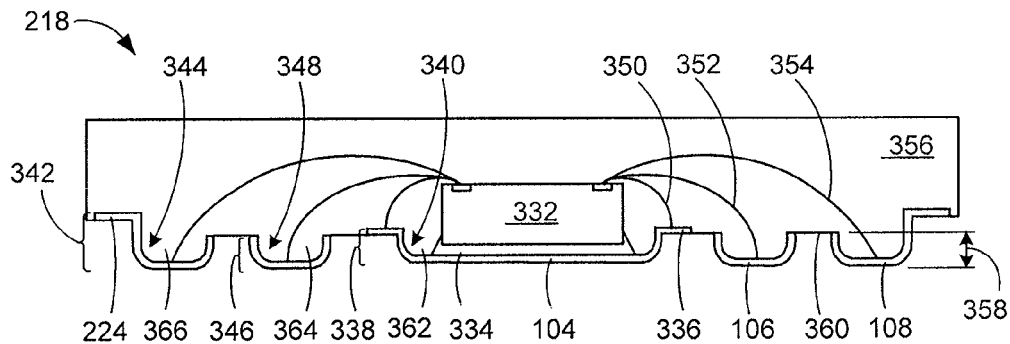
FIG. 3 is a more detailed cross-sectional view of the interface integrated circuit package system.

Referring now to FIG. 3, therein is shown a more detailed cross-sectional view of the interface integrated circuit package system 218. The more detailed cross-sectional view depicts the interface integrated circuit package system 218 in a vertically flipped orientation as shown in FIG. 2.

The interface integrated circuit package system 218 includes an integrated circuit device 332, such as an integrated circuit die, is over the paddle 104, such as a plated bump, with an inner adhesive 334 such as a die-attach adhesive. The paddle 104 includes a paddle extension 336 at the periphery of the paddle 104. The paddle extension 336 can have a paddle height 338 above a bottom of a paddle cavity 340 of the paddle 104.

The outer terminals 108, such as plated bumps, having the pad extensions 224, are adjacent to a periphery of the interface integrated circuit package system 218. The pad extensions 224 can have an outer height 342 from a bottom of an outer cavity 344 of the outer terminals 108. The inner terminals 106, such as plated bumps, can be between the outer terminals 108 and the paddle 104. The inner terminals 106 can have an inner height 346 from a bottom of an inner cavity 348.

For illustrative purposes, the interface integrated circuit package system 218 is shown with the paddle height 338 and the inner height 346 substantially the same and less than the outer height 342, although it is understood that the paddle height 338, the inner height 346, and the outer height 342 can be different. For example, the outer height 342 can be substantially the same as the paddle height 338, the inner height 346, or a combination thereof. As another example, the outer height 342, the inner height 346, and the paddle height 338 can be different from one another.

First inner interconnects 350, such as bond wires, ribbon bond wires, or reverse standoff stitch bonding (RSSB), can be between the integrated circuit device 332 within the paddle cavity 340 and the paddle 104. Second inner interconnects 352, such as bond wires, ribbon bond wires, or reverse standoff stitch bonding (RSSB), can be between the integrated circuit device 332 and the inner terminals 106 within the inner cavity 348. Third inner interconnects 354 can be between the integrated circuit device 332 and the outer terminals 108 within the outer cavity 344.

For illustrative purposes, the interface integrated circuit package system 218 is shown with the first inner interconnects 350, the second inner interconnects 352 and the third inner interconnects 354 connecting to the same connection of the integrated circuit device 332, although it is understood that the interface integrated circuit package system 218 can have different connections. For example, the first inner interconnects 350, the second inner interconnects 352 and the third inner interconnects 354 can connect to different portions of the integrated circuit device 332.

An inner encapsulation 356, such as a cover with epoxy molding compound, can cover the integrated circuit device 332, the first inner interconnects 350, the second inner interconnects 352, and the third inner interconnects 354. For example, the paddle 104, the inner terminals 106 and the outer terminals 108, can be formed in a U-shaped terminal having a bump height 358 in a non-planar configuration extending below a bottom encapsulation side 360 of the inner encapsulation 356. The outer height 342 of the outer terminals 108 can provide clearance for connection to the first interconnects 222 of FIG. 2.

The inner encapsulation 356 fills the paddle cavity 340, the inner cavity 348, and the outer cavity 344 forming paddle encapsulant bump portion 362, inner encapsulant bump portion 364, and outer encapsulant bump portion 366 of the inner encapsulation 356, respectively. The inner terminals 106, such as plated bumps, is on the inner encapsulant bump portion 364. The outer terminals 108, such as plated bumps, is on the outer encapsulant bump portion 366. The paddle 104 is on the paddle encapsulant bump portion 362 and the inner adhesive 334. As a specific example, the paddle 104, the inner terminals 106, and the outer terminals 108 are plated resin bumps. The paddle 104, the inner terminals 106, the outer terminals 108 are partially exposed by the inner encapsulation 356 and are non-planar to and extend below the bottom encapsulation side 360. The paddle 104, the inner terminals 106 and the outer terminals 108 can be formed of a single material and layer or can be formed with multiple layers, such as gold (Au), palladium (Pd), nickel (Ni), silver (Ag), tin (Sn), an alloy, or any combination thereof.

For illustrative purposes, the paddle 104, the inner terminals 106 and the outer terminals 108 are shown as U-shaped terminals, although it is understood that it can be of different geometric shapes, such as rectangular, triangular, or circular shapes. Also for illustrative purposes, the interface integrated circuit package system 218 is shown with the first inner interconnects 350, the second inner interconnects 352 and the third inner interconnects for connecting the integrated circuit device 332 with the paddle 104, the inner terminals 106 and the outer terminals 108 respectively, although it is understood that the interface integrated circuit package system 218 can have a different configuration. For example, the interface integrated circuit package system 218 can use the first inner interconnects 350 without the second inner interconnects 352 or the third inner interconnects 354, or the second inner interconnects 352 without the first inner interconnects 350 or the third inner interconnects 354.

Figure 4:
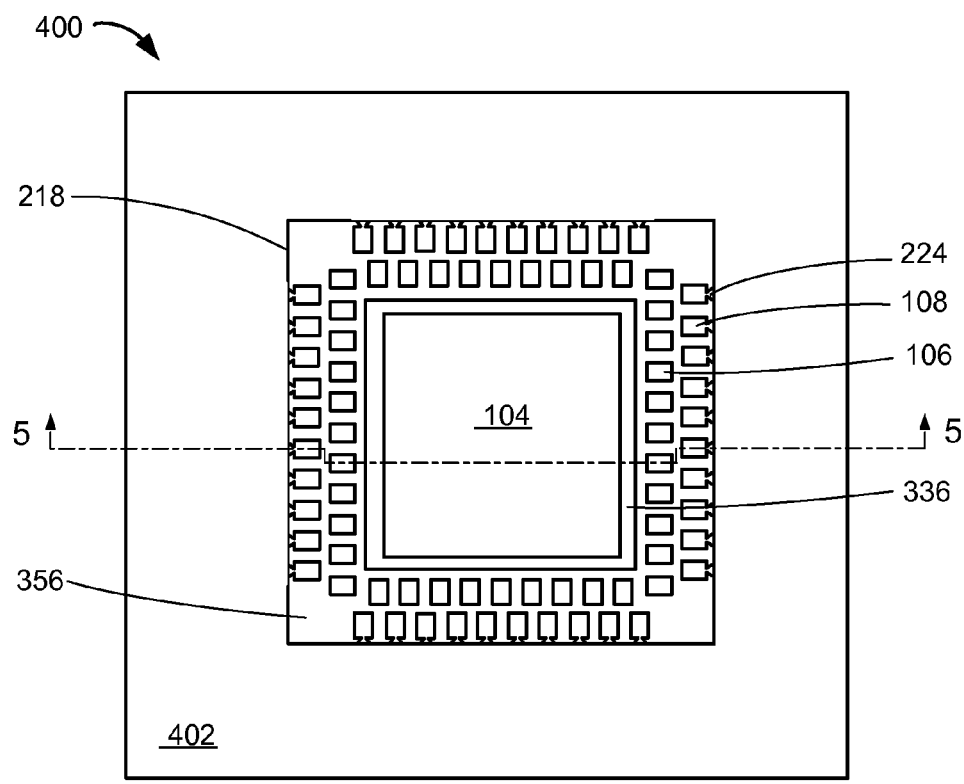
FIG. 4 is a top view of a mountable integrated circuit package-in-package system in a second embodiment of the present invention.

Referring now to FIG. 4, therein is shown a top view of a mountable integrated circuit package-in-package system 400 in a second embodiment of the present invention. The mountable integrated circuit package-in-package system 400 includes structural similarities to the mountable integrated circuit package-in-package system 100 of FIG. 1. The top view depicts a package encapsulation 402, such as a glob top cover, partially exposing the interface integrated circuit package system 218. The package encapsulation 402 can also expose the paddle 104, the inner terminals 106, the outer terminals 108, and a portion of the inner encapsulation 356. The package encapsulation 402 can expose the paddle extension 336 and a portion of the pad extensions 224 of the outer terminals 108.

Figure 5:
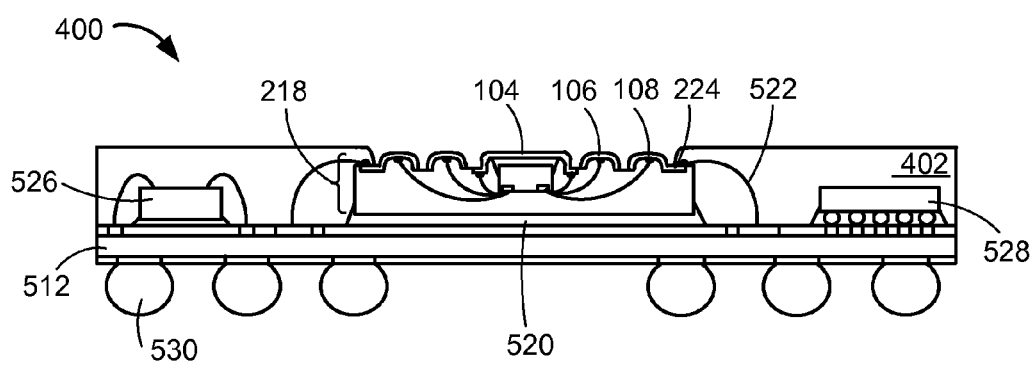
FIG. 5 is a cross-sectional view of the mountable integrated circuit package-in-package system along line 5-5 of FIG. 4.

Referring now to FIG. 5, therein is shown a cross-sectional view of the mountable integrated circuit package-in-package system 400 along line 5-5 of FIG. 4. The cross-sectional view depicts a package carrier 512, such as a laminated substrate. The interface integrated circuit package system 218 can be over the package carrier 512 with a second adhesive 520 such as film adhesive or a die-attach adhesive. The paddle 104, the inner terminals 106, and the outer terminals 108 are facing away from the package carrier 512. The interface integrated circuit package system 218 can be tested without assembly of the mountable integrated circuit package-in-package system 400 ensuring known good device (KGD) are assembled therein. This improves manufacturing yield and reduces cost.

First interconnects 522, such as bond wires, ribbon bond wires, or reverse standoff stitch bonding (RSSB), can connect between the pad extensions 224 of the outer terminals 108 of the interface integrated circuit package system 218 and the package carrier 512. A first device 526, such as a wire bonded integrated circuit die, and a second device 528, such as a flip chip, can be mounted over the package carrier 512.

The package encapsulation 402 can cover the first interconnects 522, the first device 526, and the second device 528 over the package carrier 512. The package encapsulation 402 partially exposes the interface integrated circuit package system 218. External interconnects 530, such as solder balls, can attach to and below the package carrier 512 for electrical connection to the next system level (not shown), such as a printed circuit board or another integrated circuit package system.

Figure 6:
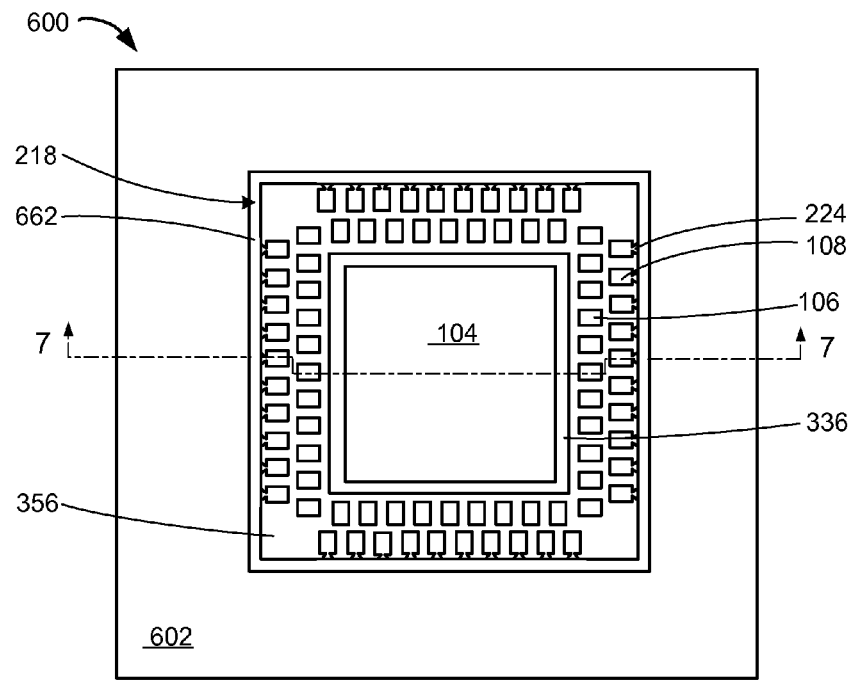
FIG. 6 is a top view of a mountable integrated circuit package-in-package system in a third embodiment of the present invention.

Referring now to FIG. 6, therein shown a top view of a mountable integrated circuit package-in-package system 600 in a third embodiment of the present invention. The mountable integrated circuit package-in-package system 600 includes structural similarities to the mountable integrated circuit package-in-package system 100 of FIG. 1 and the mountable integrated circuit package-in-package system 400 of FIG. 4. The top view depicts a package encapsulation 602, such as a cover with an epoxy molding compound, surrounding a dam ring 662, such as a resin dam. The package encapsulation 602 and the dam ring 662 can partially expose the interface integrated circuit package system 218. The dam ring 662 includes an opening exposing the paddle 104, the inner terminals 106, the outer terminals 108, and a portion of the inner encapsulation 356. The dam ring 662 can expose the paddle extension 336 and a portion of the pad extensions 224 of the outer terminals 108.

Figure 7:
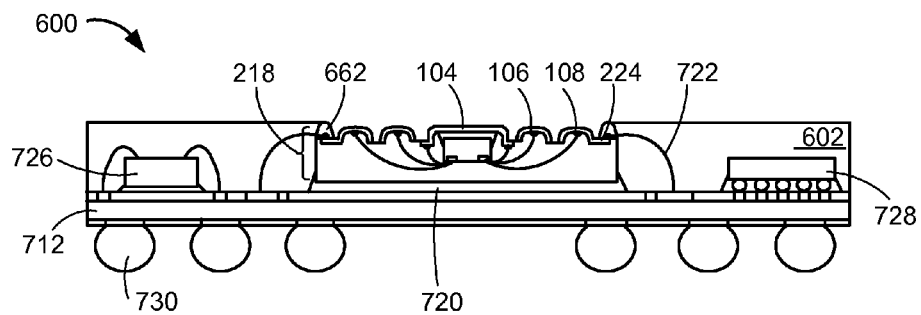
FIG. 7 is a cross-sectional view of the mountable integrated circuit package-in-package system along line 7-7 of FIG. 6.

Referring now to FIG. 7, therein is shown a cross-sectional view of the mountable integrated circuit package-in-package system 600 along line 7-7 of FIG. 6. The cross-sectional view depicts a package carrier 712, such as a laminated substrate. The interface integrated circuit package system 218 can be over the package carrier 712 with a second adhesive 720 such as film adhesive or a die-attach adhesive. The paddle 104, the inner terminals 106, and the outer terminals 108 are facing away from the package carrier 712. The interface integrated circuit package system 218 can be tested without assembly of the mountable integrated circuit package-in-package system 600 ensuring known good device (KGD) are assembled therein. This improves manufacturing yield and reduces cost.

First interconnects 722, such as bond wires, ribbon bond wires, or reverse standoff stitch bonding (RSSB), can connect between the pad extensions 224 of the outer terminals 108 of the interface integrated circuit package system 218 and the package carrier 712. A first device 726, such as a wire bonded integrated circuit die, and a second device 728, such as a flip chip, can be mounted over the package carrier 712.

The package encapsulation 602 can cover the first interconnects 722, the first device 726, and the second device 728 over the package carrier 712. The package encapsulation 602 partially exposes the interface integrated circuit package system 218. The dam ring 662 can cover the first interconnects 722 at the connection to the pad extensions 224. External interconnects 730, such as solder balls, can attach to and below the package carrier 712 for electrical connection to the next system level (not shown), such as a printed circuit board or another integrated circuit package system.

Figure 8:
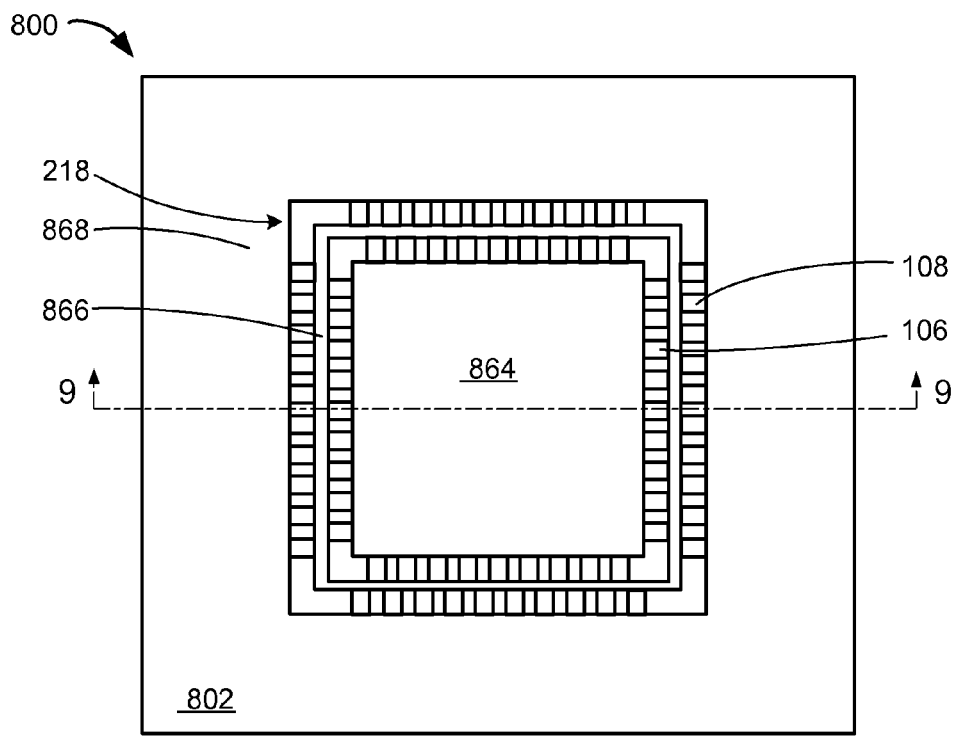
FIG. 8 is a top view of a mountable integrated circuit package-in-package system in a fourth embodiment of the present invention.

Referring now to FIG. 8, therein shown a top view of a mountable integrated circuit package-in-package system 800 in a fourth embodiment of the present invention. The mountable integrated circuit package-in-package system 800 includes structural similarities to the mountable integrated circuit package-in-package system 600 of FIG. 6. The top view depicts a package encapsulation 802, such as a cover with epoxy molding compound, partially exposing the interface integrated circuit package system 218.

The package encapsulation 802 includes a central cover 864, a ring cover 866 around the central cover 864, and an outer portion 868 which is peripheral to the ring cover 866. Gaps between the ring cover 866 and the central cover 864 as well as the outer portion 868 can expose the inner terminals 106 and the outer terminals 108, respectively.

Figure 9:
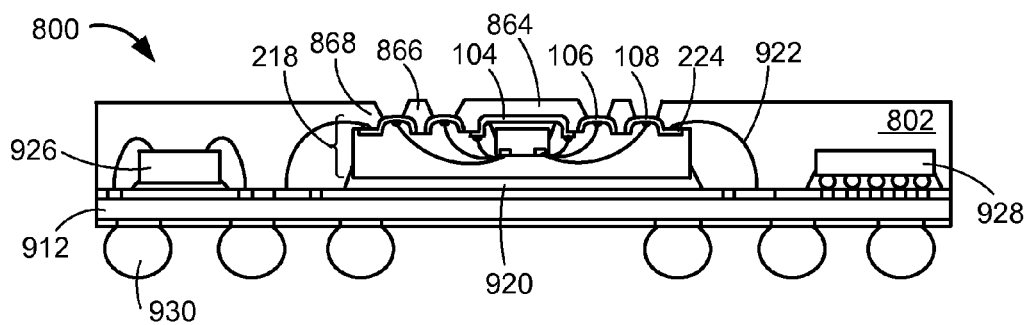
FIG. 9 is a cross-sectional view of the mountable integrated circuit package-in-package system along line 9-9 of FIG. 8.

Referring now to FIG. 9, therein is shown a cross-sectional view of the mountable integrated circuit package-in-package system 800 along line 9-9 of FIG. 8. The cross-sectional view depicts a package carrier 912, such as a laminated substrate. The interface integrated circuit package system 218 can be over the package carrier 912 with a second adhesive 920 such as film adhesive or a die-attach adhesive. The paddle 104, the inner terminals 106, and the outer terminals 108 are facing away from the package carrier 912. The interface integrated circuit package system 218 can be tested without assembly of the mountable integrated circuit package-in-package system 800 ensuring known good device (KGD) are assembled therein. This improves manufacturing yield and reduces cost.

First interconnects 922, such as bond wires, ribbon bond wires, or reverse standoff stitch bonding (RSSB), can connect between the pad extensions 224 of the outer terminals 108 of the interface integrated circuit package system 218 and the package carrier 912. A first device 926, such as a wire bonded integrated circuit die, and a second device 928, such as a flip chip, can be mounted over the package carrier 912.

The package encapsulation 802 can cover the first interconnects 922, the first device 926, and the second device 928 over the package carrier 912. The outer portion 868 can cover the first interconnects 922. The ring cover 866 is over a space between the inner terminals 106 and the outer terminals 108. The central cover 864 can be over the paddle 104 and a space between the paddle 104 and the inner terminals 106. External interconnects 930, such as solder balls, can attach to and below the package carrier 912 for electrical connection to the next system level (not shown), such as a printed circuit board or another integrated circuit package system.

Figure 10:
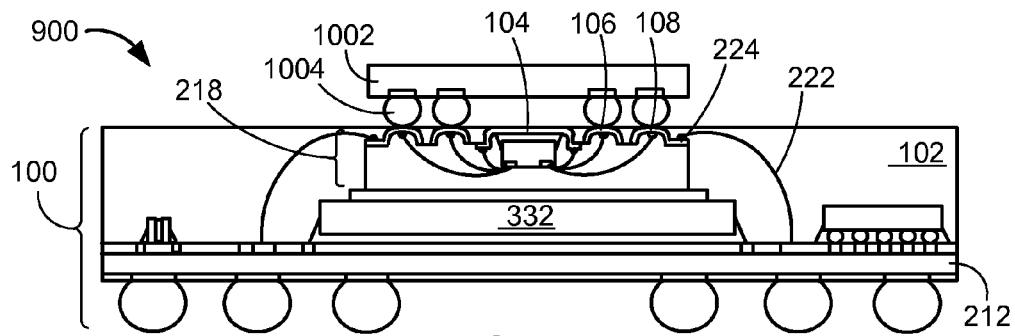
FIG. 10 is a cross-sectional view of a mountable integrated circuit package-on-package system with an application of the mountable integrated circuit package-in-package system of FIG. 2 in a fifth embodiment of the present invention.

Referring now to FIG. 10, therein is shown a cross-sectional view of a mountable integrated circuit package-on-package system 1000 with an application of the mountable integrated circuit package-in-package system 100 of FIG. 2 in a fifth embodiment of the present invention. An external device 1002 such as flip chip, a ball grid array device, or a land grid array device, can be mounted over the mountable integrated circuit package-in-package system 100.

The external device 1002 includes electrical connectors 1004, such as solder balls, that connect to the outer terminals 108 and the inner terminals 106 exposed from the package encapsulation 102. The pad extensions 224 can provide connection paths between the external device 1002 and the package carrier 212 through the first interconnects 222. The external device 1002 can also connect with the integrated circuit device 332 in the interface integrated circuit package system 218.

Figure 11:
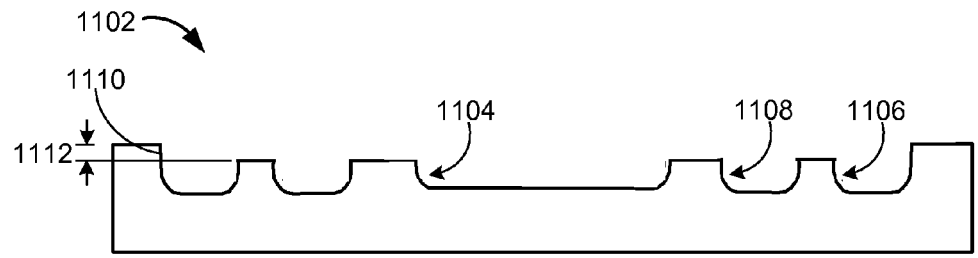
FIG. 11 is a cross-section view of a leadframe.

Referring now to FIG. 11, therein is shown a cross-sectional view of a leadframe 1102. The leadframe 1102 can be formed of material such as copper. The leadframe 1102 can include a central recess 1104, outer recesses 1108, and inner recesses 1106 between the central recess 1104 and the outer recesses 1108. The outer portion of the outer recesses 1108 includes a standoff 1110 with a standoff height 1112 from portions of the leadframe 1102 between the outer recesses 1108 and the inner recesses 1106 as well as from portions of the leadframe 1102 between the inner recesses 1106 and the central recess 1104.

Figure 12:
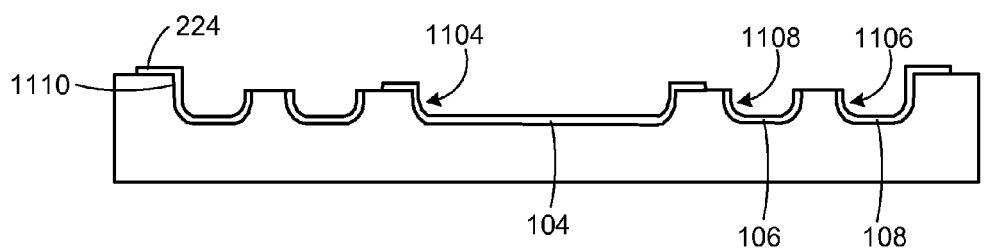
FIG. 12 is the structure of FIG. 11 in forming of the paddle, the inner terminals, and the outer terminals.

Referring now to FIG. 12, therein is shown the structure of FIG. 11 in forming of the paddle 104, the inner terminals 106, and the outer terminals 108. The paddle 104 can be formed by plating the central recess 1104. The inner terminals 106 can be formed by plating the inner recesses 1106. The outer terminals 108 can be formed by plating the outer recesses 1108 and a portion of the standoff 1110 for forming the pad extensions 224.

Figure 13:
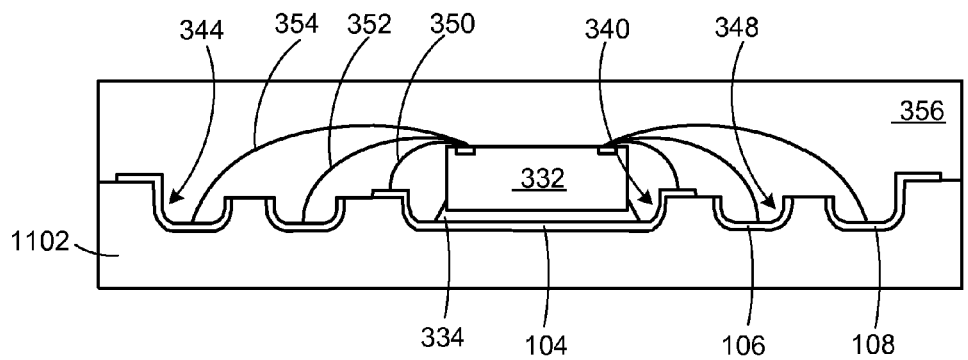
FIG. 13 is the structure of FIG. 12 in forming the inner encapsulation over the integrated circuit device.

Referring now to FIG. 13, therein is shown the structure of FIG. 12 in forming the inner encapsulation 356 over the integrated circuit device 332. The integrated circuit device 332 can be mounted over the paddle 104 with the inner adhesive 334. The first inner interconnects 350, the second inner interconnects 352, and the third inner interconnects for connecting the integrated circuit device 332 with the paddle 104, the inner terminals 106, and the outer terminals 108 respectively. The inner encapsulation 356 covers the integrated circuit device 332, the first inner interconnects 350, the second inner interconnects 352, and the third inner interconnects 354. The inner encapsulation 356 fills the paddle cavity 340, the inner cavity 348, and the outer cavity 344. The inner encapsulation 356 can also be over the exposed portion of the leadframe 1102.

Figure 14:
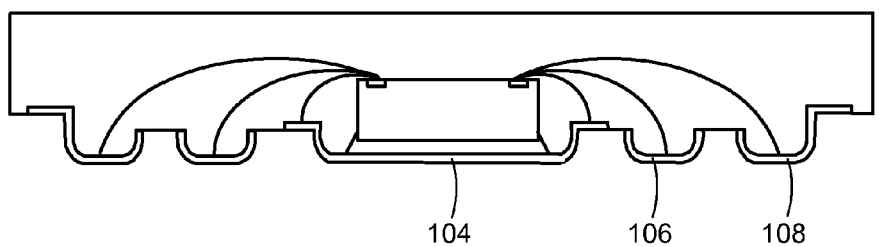
FIG. 14 is the structure of FIG. 13 in exposing the paddle, the inner terminals, and the outer terminals.

Referring now to FIG. 14, therein is shown the structure of FIG. 13 in exposing the paddle 104, the inner terminals 106, and the outer terminals 108. The leadframe 1102 of FIG. 13 can be removed exposing the paddle 104, the inner terminals 106, and the outer terminals 108. The paddle 104, the inner terminals 106, and the outer terminals 108 can undergo a chemical or mechanical deflash process removing resin and exposes the outer U-shaped plated resin bumps of the paddle 104, the inner terminals 106, and the outer terminals 108.

Figure 15:
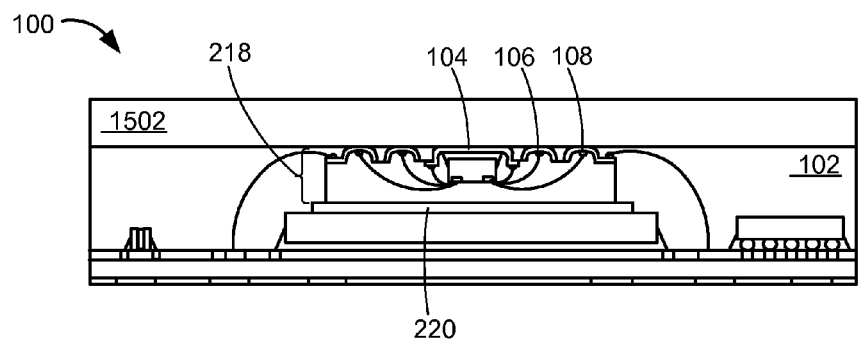
FIG. 15 is a cross-sectional view of the mountable integrated circuit package-in-package system of FIG. 2 in a molding the package encapsulation.

Referring now to FIG. 15, therein is a cross-sectional view of the mountable integrated circuit package-in-package system 100 of FIG. 2 in molding the package encapsulation 102. A mold chase 1502 can be over the interface integrated circuit package system 218 forming a seal to prevent mold flashing of the exposed portion of the paddle 104, the inner terminals 106, and the outer terminals 108. The mold chase 1502 can include high polished smooth surface in the location where it comes in contact with the paddle 104, the inner terminals 106, and the outer terminals 108 to be exposed by the package encapsulation 102.

The mold chase 1502 can include a film (not shown), such as a soft high temperature molding film, silicon rubber, or Teflon inserts, that faces the interface integrated circuit package system 218. The film can mitigate or prevent damage to the paddle 104, the inner terminals 106, and the outer terminals 108.

The package encapsulation 102 can be formed by dispensing a material, such as molding compounds, a resin, or a non-conductive epoxy. The mold chase 1502 can be removed after the package encapsulation 102 sets or is cured to expose the paddle 104, the inner terminals 106 and the outer terminals 108 and forming the mountable integrated circuit package-in-package system 100.

The second adhesive 220 possess a characteristic with an appropriate elastic modulus preferably pliant enough to absorb stress, yet rigid enough to be wire-bonded without bouncing, as the attach medium can lead to more consistent bond line thickness (BLT) and attach height. This can minimize damage to the exposed terminals by having a more controlled, mild and consistent pressure on the exposed terminals during the manufacturing package encapsulation molding process.

Figure 16:
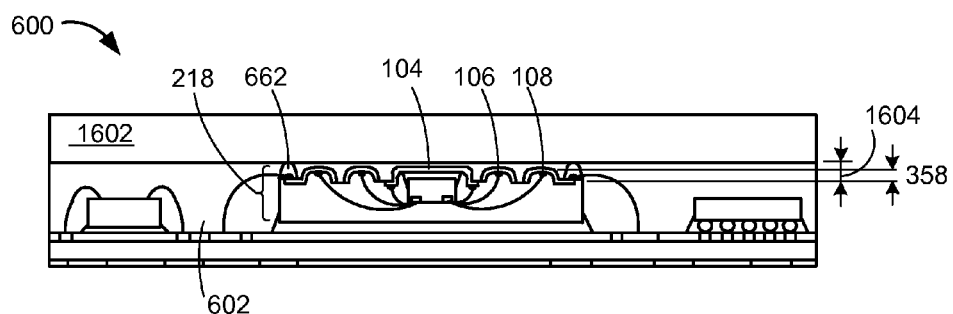
FIG. 16 is a cross-sectional view of the mountable integrated circuit package-in-package system of FIG. 7 in molding the package encapsulation.

Referring now to FIG. 16, is a cross-sectional view of the mountable integrated circuit package-in-package system 600 of FIG. 7 in molding the package encapsulation 602. A mold chase 1602 is over the interface integrated circuit package system 218 making contact with the dam ring 662. The dam ring 662 includes a dam height 1604 that extend beyond the bump height 358 such that the dam ring 662 protects damage to the paddle 104, the inner terminals 106, and the outer terminals 108 by the compression force with the mold chase 1602.

The mold chase 1602 can include a film (not shown), such as a soft high temperature molding film, silicon rubber, or Teflon inserts, that faces the interface integrated circuit package system 218. The film can mitigate or prevent damage to the dam ring 662.

The package encapsulation 602 can be formed by dispensing a material, such as molding compounds, a resin, or a non-conductive epoxy. The dam ring 662 prevents the package encapsulation 602 from forming over the opening within the dam ring 662. The mold chase 1602 can be removed after the package encapsulation 602 sets or is cured to expose the paddle 104, the inner terminals 106 and the outer terminals 108 and forming the mountable integrated circuit package-in-package system 600.

Figure 17:
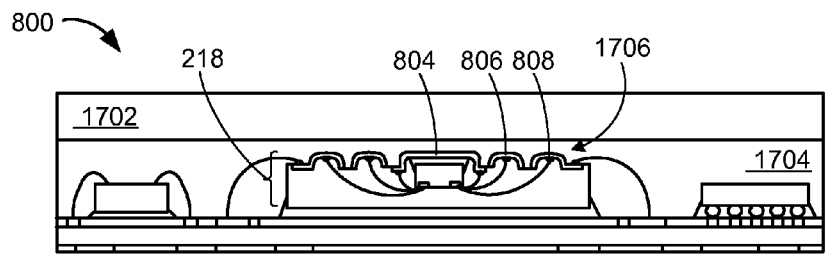
FIG. 17 is a cross-sectional view of the mountable integrated circuit package-in-package system of FIG. 9 in molding an intermediate encapsulation.

Referring now to FIG. 17, therein is shown a cross-sectional view of the mountable integrated circuit package-in-package system 800 of FIG. 9 in molding an intermediate encapsulation 1704. A mold chase 1702 can be placed over the interface integrated circuit package system 218 without contacting the interface integrated circuit package system 218. A molding space 1706 between the mold chase 1702 and the interface integrated circuit package system 218 prevents compression damage with the mold chase 1702 to the paddle 104, the inner terminals 106, and the outer terminals 108.

The mold chase 1702 can include a film (not shown), such as a soft high temperature molding film, silicon rubber, or Teflon inserts, that faces the interface integrated circuit package system 218. The film can mitigate or prevent damage to the interface integrated circuit package system 218.

The mold chase 1702 can be removed after the intermediate encapsulation 1704 sets or is cured. The intermediate encapsulation 1704 can undergo a chemical or mechanical deflash process forming the package encapsulation 802 of FIG. 9 and exposing the paddle 104, the inner terminals 106, and the outer terminals 108.

Figure 18:
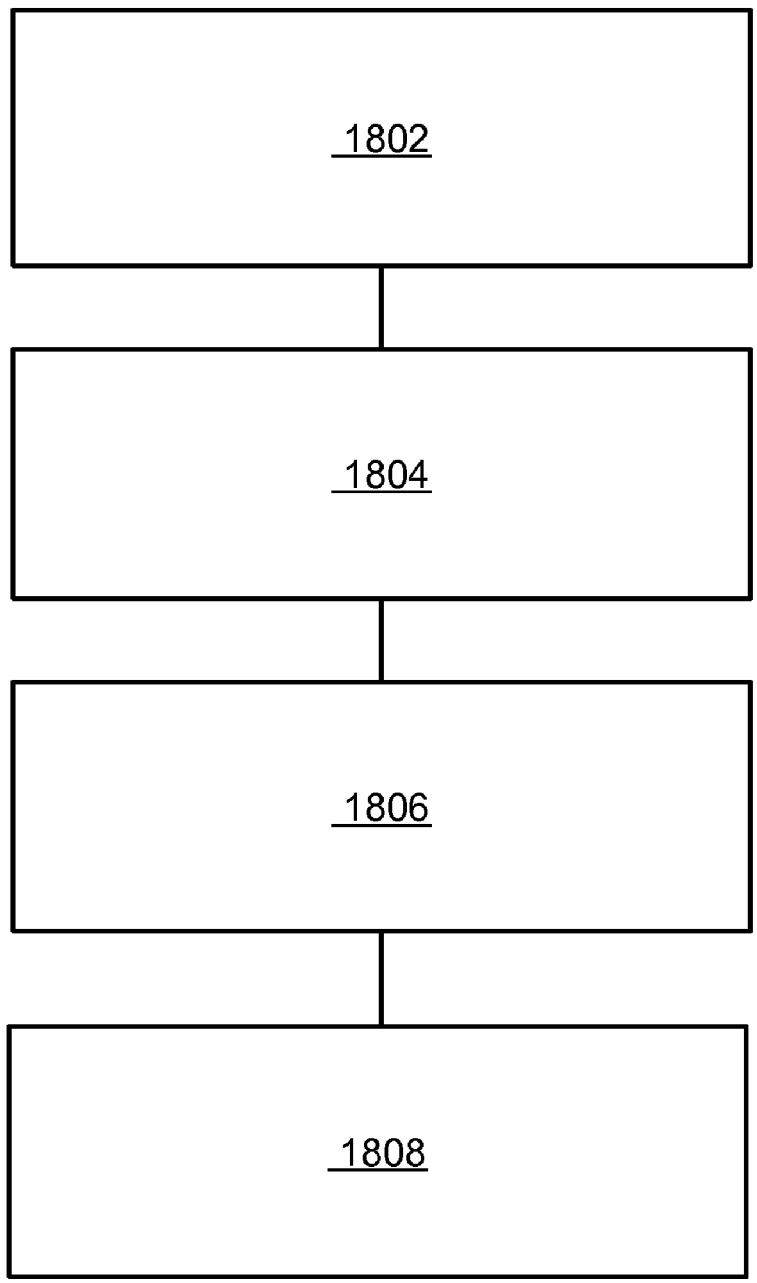
FIG. 18 is a flow chart of a mountable integrated circuit package-in-package system for manufacture of the mountable integrated circuit package-in-package system in an embodiment of the present invention.

Referring now to FIG. 18, therein is shown a flow chart of a mountable integrated circuit package-in-package system 1800 for manufacture of the mountable integrated circuit package-in-package system 100 in an embodiment of the present invention. The system 1800 includes providing an interface integrated circuit package system with a terminal having a plated bumped portion of an inner encapsulation in a block 1802; mounting the interface integrated circuit package system over a package carrier with the terminal facing away from the package carrier in a block 1804; connecting the package carrier and a pad extension of the terminal in a block 1806; and forming a package encapsulation over the interface integrated circuit package system with the terminal exposed in a block 1808.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the mountable integrated circuit package-in-package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A mountable integrated circuit package-in-package system comprising:
    providing an interface integrated circuit package system with a terminal having a plated bump on an encapsulant bump portion of an inner encapsulation;
    mounting the interface integrated circuit package system over a package carrier with the terminal facing away from the package carrier;
    connecting the package carrier and a pad extension of the terminal; and
    forming a package encapsulation over the interface integrated circuit package system with the terminal exposed.

2. The system as claimed in claim 1 further comprising mounting a device over the package carrier and adjacent to the interface integrated circuit package system.

3. The system as claimed in claim 1 further comprising forming a dam ring adjacent the package encapsulation for exposing the terminal.

4. The system as claimed in claim 1 wherein forming the package encapsulation includes forming a ring cover for exposing the terminal.

5. The system as claimed in claim 1 further comprising mounting an external device having an electrical connector connected with the terminal.

6. A mountable integrated circuit package-in-package system comprising:
    providing an interface integrated circuit package system with a terminal having a plated bump on an encapsulant bump portion of an inner encapsulation;
    mounting the interface integrated circuit package system over a package carrier with the terminal facing away from the package carrier;
    connecting an interconnect between the package carrier and a pad extension of the terminal; and
    forming a package encapsulation over the interface integrated circuit package system with a portion of the terminal exposed and the pad extension covered.

7. The system as claimed in claim 6 further comprising mounting an integrated circuit over the package carrier and below the interface integrated circuit package system.

8. The system as claimed in claim 6 wherein providing the interface integrated circuit package system includes:
    providing an integrated circuit device; and
    connecting the integrated circuit device with the terminal and within a cavity of the terminal.

9. The system as claimed in claim 6 wherein providing the interface integrated circuit package system includes:
    providing the terminal having a cavity; and
    forming the inner encapsulation includes filling the cavity of the terminal.

10. The system as claimed in claim 6 wherein mounting the interface integrated circuit package system includes attaching an adhesive film between the interface integrated circuit package system and the package carrier.

11. A mountable integrated circuit package-in-package system comprising:
    a package carrier;
    an interface integrated circuit package system, with a terminal having a plated bump on an encapsulant bump portion of an inner encapsulation, over the package carrier with the terminal facing away from the package carrier, and the package carrier connected with a pad extension of the terminal; and
    a package encapsulation over the interface integrated circuit package system with the terminal exposed.

12. The system as claimed in claim 11 further comprising a device over the package carrier and adjacent to the interface integrated circuit package system.

13. The system as claimed in claim 11 further comprising a dam ring adjacent the package encapsulation for exposing the terminal.

14. The system as claimed in claim 11 wherein the package encapsulation includes a ring cover for exposing the terminal.

15. The system as claimed in claim 11 further comprising an external device having an electrical connector connected with the terminal.

16. The system as claimed in claim 11 wherein:
    the package encapsulation exposes a portion of the terminal and covers the pad extension of the terminal; and
    further comprising an interconnect between the package carrier and the pad extension of the terminal.

17. The system as claimed in claim 16 further comprising an integrated circuit over the package carrier and below the interface integrated circuit package system.

18. The system as claimed in claim 16 wherein the interface integrated circuit package system includes an integrated circuit device connected with the terminal and within a cavity of the terminal.

19. The system as claimed in claim 16 wherein the interface integrated circuit package system includes:
    the terminal having a cavity; and
    an inner encapsulation is in the cavity of the terminal.

20. The system as claimed in claim 16 wherein the interface integrated circuit package system includes an adhesive film between the interface integrated circuit package system and the package carrier.

* * * * *